United States Patent
Imahara et al.

(10) Patent No.: US 10,008,372 B2
(45) Date of Patent: Jun. 26, 2018

(54) FILM DEPOSITION APPARATUS

(71) Applicant: Sakai Display Products Corporation, Sakai-shi, Osaka (JP)

(72) Inventors: Hirokazu Imahara, Sakai (JP); Yasuhiro Wakamori, Sakai (JP)

(73) Assignee: Sakai Display Products Corporation, Sakai-shi, Osaka (JP)

( * ) Notice: Subject to any disclaimer, the term of this patent is extended or adjusted under 35 U.S.C. 154(b) by 0 days. days.

(21) Appl. No.: 15/117,603

(22) PCT Filed: Feb. 19, 2014

(86) PCT No.: PCT/JP2014/053925
§ 371 (c)(1),
(2) Date: Aug. 9, 2016

(87) PCT Pub. No.: WO2015/125242
PCT Pub. Date: Aug. 27, 2015

(65) Prior Publication Data
US 2016/0348237 A1    Dec. 1, 2016

(51) Int. Cl.
C23C 14/00    (2006.01)
C25B 11/00    (2006.01)
(Continued)

(52) U.S. Cl.
CPC .......... H01J 37/3441 (2013.01); C23C 14/22 (2013.01); C23C 14/564 (2013.01);
(Continued)

(58) Field of Classification Search
CPC .................................................. H01J 37/3441
See application file for complete search history.

(56) References Cited

U.S. PATENT DOCUMENTS 6,398,929 B1 *   6/2002   Chiang .................. C23C 14/046
                                                              204/298.11
2001/0008208 A1   7/2001   Futagawa et al.
2008/0257263 A1   10/2008  Pavloff et al.

FOREIGN PATENT DOCUMENTS

JP    H11-241163 A    9/1999
JP    2000-273626 A    10/2000

* cited by examiner

*Primary Examiner* — Ibrahime A Abraham
(74) *Attorney, Agent, or Firm* — Rudy J. Ng; Bret E. Field; Bozicevic, Field & Francis LLP

(57) ABSTRACT

A film deposition apparatus, comprising: a deposition preventive plate which is located in a processing chamber performing film deposition processing on a substrate so as to surround a processing region in the processing chamber for processing on the substrate, and which prevents a film deposition material from being attached to an inner wall of the processing chamber, wherein the deposition preventive plate is configured by arranging a plurality of component plates of which respective end portions are overlapped with each other at a gap, such that a thermal expansion generated due to the film deposition processing is absorbed by a relative movement of an overlapped part in two adjacent component plates of the plurality of component plates in a width direction of the overlapped part, and a concave part is provided at the overlapped part to make the gap provided in a side communicating with the processing region be larger than that provided in the other side, thin parts provided in the respective end portions of the two adjacent component plates are overlapped with each other, and a surface facing the processing region in the overlapped part and a surface facing the processing region in non-overlapped part are on the same plane, and a surface facing the inner wall in the overlapped part and a surface facing the inner wall in non-overlapped part are on the same plane.

14 Claims, 8 Drawing Sheets

(51) Int. Cl.
  *C25B 13/00* (2006.01)
  *H01J 37/34* (2006.01)
  *C23C 14/56* (2006.01)
  *C23C 16/44* (2006.01)
  *C23C 14/22* (2006.01)
(52) U.S. Cl.
  CPC .......... *C23C 16/44* (2013.01); *C23C 16/4404* (2013.01); *H01J 37/34* (2013.01); *H01J 37/3411* (2013.01)

F I G. 3A
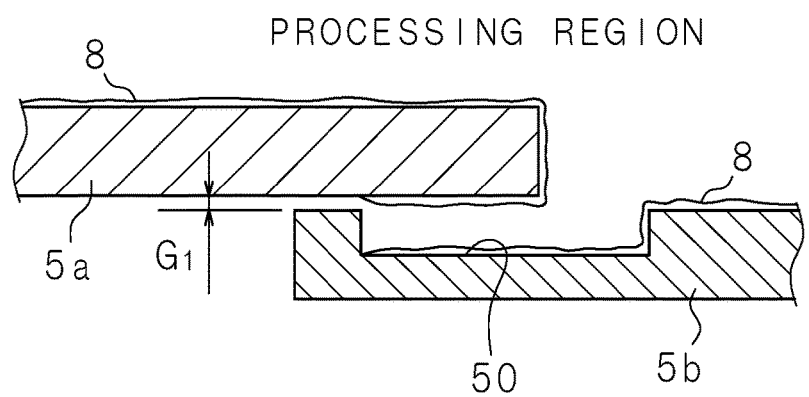
F I G. 3B
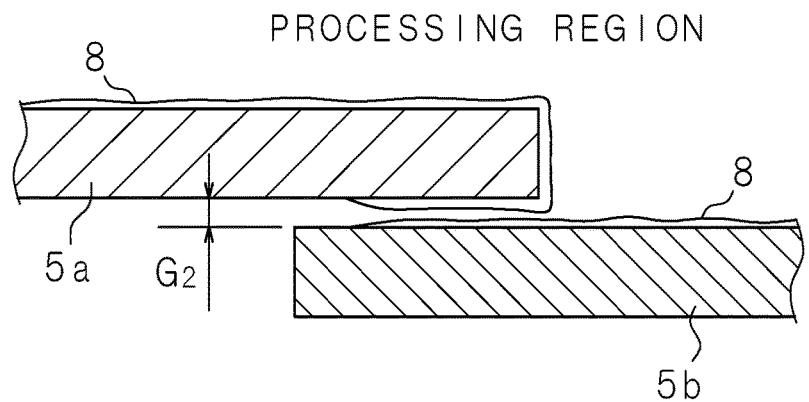

F I G. 6
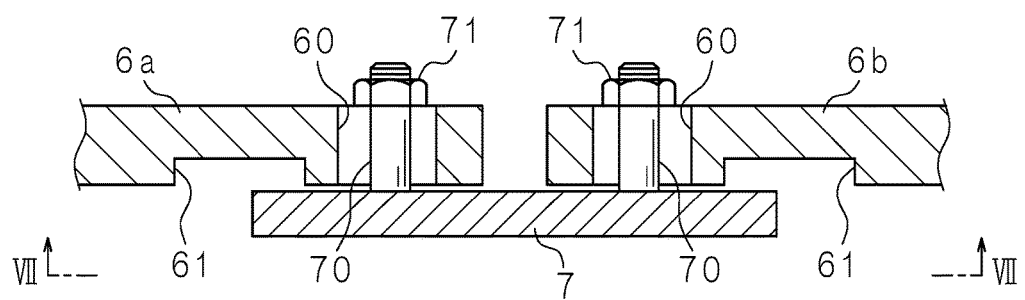

F I G. 7
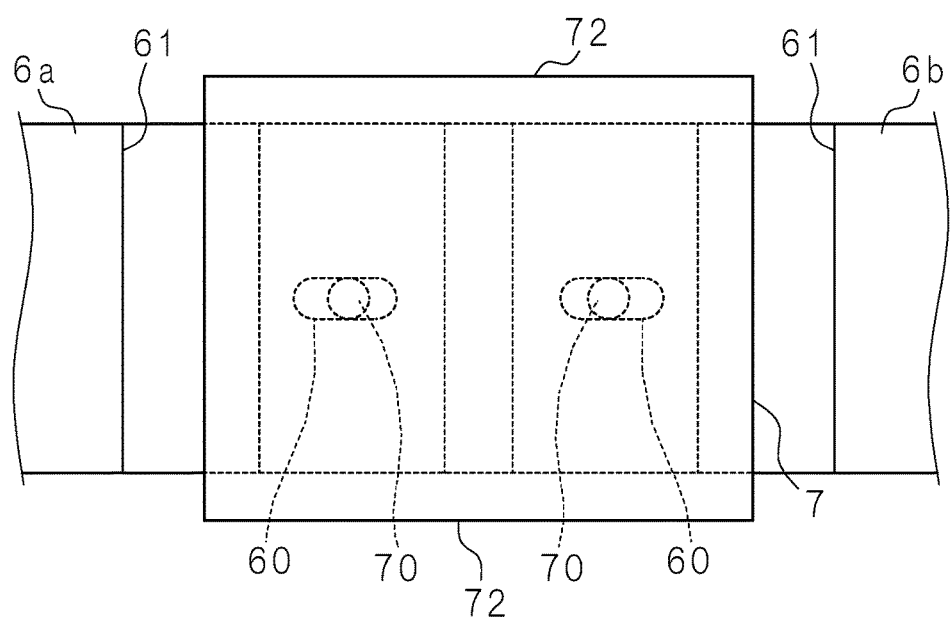

FILM DEPOSITION APPARATUS

CROSS-REFERENCE TO RELATED APPLICATIONS

This application is the national phase under 35 U.S.C. § 371 of PCT International Application No. PCT/JP2014/053925 which has International filing date of Feb. 19, 2014 and designated the United States of America.

FIELD

The technology herein relates to a film deposition apparatus which is configured to deposit a thin film on a surface of a substrate disposed in a processing chamber of a sputtering apparatus, a CVD apparatus, a PVD apparatus or the like.

BACKGROUND AND SUMMARY

For example, in manufacturing of a liquid crystal panel for an image display, various semiconductors, or the like, a sputtering apparatus which forms a thin film of metal on one surface of a substrate is used. The sputtering apparatus is configured in such a manner that the substrate and targets are disposed to face each other inside of a processing chamber maintained at high vacuum, rare gases (Ar gases, etc.) are introduced into the processing chamber as well as a high voltage is applied between the substrate and the targets, and ionized rare gas elements collide with target surfaces, such that atoms of the target surfaces are sprung out to form a thin film of a metallic material of the targets on the surface of the substrate.

In the sputtering apparatus, a part of target atoms sprung out from the targets may be attached to an inner wall of the processing chamber to form an unnecessary metal film on the inner wall. Therefore, conventionally, a deposition preventive plate is disposed inside of the processing chamber to isolate between the inner wall and a processing region, and prevents the metal film from being deposited on the inner wall by allowing for a film deposition on the deposition preventive plate.

Meanwhile, for example, in manufacturing of the liquid crystal panel, when using a large-size glass substrate, and depositing a thick metal film by a material having high conductivity such as Cu, a processing time is long, and a temperature in the processing chamber reaches a high temperature.

Therefore, the deposition preventive plate disposed as described above is formed by arranging a plurality of component plates of which respective end portions are overlapped with each other at a gap, so as to absorb a thermal expansion due to film deposition processing by a relative movement of each component plate in a direction of the overlapped width.

In the deposition preventive plate configured as described above, the gap of the overlapped portion of the component plates functions as a labyrinth gap to seal the processing region side and the inner wall side. In order to enhance the sealing function, it is preferable to set to be a small gap of about several mm. Meanwhile, since the metal film is also attached to the gap, the attachment sites of the metal films contact with each other due to the relative movement at the time of thermal expansion, and further due to a thermal deformation of the component plates, such that the metal films are peeled-off and mixed into a film being formed on the substrate, and thus a problem of a deterioration in a film deposition quality occurs.

When the above-described problem occurs, it is necessary to be forced to take measures such as a replacement of the deposition preventive plate, and to take a pause of an operation of a film deposition apparatus during this period, as well as there is a problem that a decrease in an operation rate may occur.

These problems may be solved by increasing the gap of the overlapped portion of the component plates. However, the sealing function is insufficient, and the target atoms in a film deposition region are sprung out to an outside, such that the deposition preventive plate may not serve the original function to prevent the unnecessary film deposition on the inner wall of the processing chamber.

Further, the above-described problems also occur in a vacuum deposition apparatus such as a chemical vapor deposition (CVD) apparatus, a physical vapor deposition (PVD) apparatus or the like.

In consideration of the above-mentioned circumstances, it is an object to provide an aspect of disclosure of a film deposition apparatus that can prevent peeling off of a metal film occurred in a structure for absorbing a thermal expansion, while maintaining a sufficient sealing function by a deposition preventive plate, and enables film deposition processing at a high operation rate.

According to one embodiment of the present disclosure, there is provided a film deposition apparatus comprising, a deposition preventive plate which is located in a processing chamber performing film deposition processing on a substrate so as to surround a processing region in the processing chamber for processing on the substrate, and which prevents a film deposition material from being attached to an inner wall of the processing chamber, wherein the deposition preventive plate is configured by arranging a plurality of component plates of which respective end portions are overlapped with each other at a gap, such that a thermal expansion generated due to the film deposition processing is absorbed by a relative movement of an overlapped part in two adjacent component plates of the plurality of component plates in a width direction of the overlapped part, and a concave part is provided at the overlapped part to make the gap provided in a side communicating with the processing region be larger than that provided in the other side.

The overlapped part in the component plates forming the deposition preventive plate is provided with the concave part. The concave part makes the gap between the component plates provided in the side communicating with the processing region be larger than that provided in the other side. In the overlapped part in the component plates, metal films are formed on facing surfaces thereof with the processing region during film deposition processing. The sites where metal films are formed are the facing surfaces of the overlapped part having an expanded gap by the concave part, and a possibility of contacting with each other when the component plates move relative to each other for absorbing thermal expansion is low, such that a deterioration in a film deposition quality due to mixing of a peeled-off material could be prevented. In addition, the overlapped part may maintain a sufficient sealing function by the gaps at portions other than the concave part.

In the embodiment of the present disclosure, it is preferred that the concave part is a concave groove which is continued in a longitudinal direction of the overlapped part.

The concave part is formed as the concave groove which is continued in the longitudinal direction of the overlapped part, such that it is possible to prevent the peeling-off of the metal film over an entire length of the overlapped part.

In the embodiment of the present disclosure, it is preferred that thin parts provided in the respective component plate of the two adjacent component plates are overlapped with each other, and a surface facing the processing region in the overlapped part and a surface facing the processing region in non-overlapped part are on the same plane, and a surface facing the inner wall in the overlapped part and a surface facing the inner wall in non-overlapped part are on the same plane.

The overlapped part in the component plates is formed by overlapping the thin parts provided in each component plate with each other. In view of surfaces facing the processing region or the inner wall, the overlapped part and the non-overlapped part become the same level as each other, and thereby a deposition preventive plate which does not have a step could be achieved. The gap of the overlapped part is formed in a crank shape to improve the sealing function by a labyrinth effect.

In the embodiment of the present disclosure, it is preferred that the concave part is provided in one of the thin parts which has the surface facing the inner wall.

When forming the overlapped part by overlapping the thin parts, the object could be achieved by forming the concave part in one of the thin parts which has the surface facing the inner wall.

In the embodiment of the present disclosure, it is preferred that the film deposition apparatus further comprises: a plurality of targets disposed inside of the processing chamber; and a partition plate configured to isolate the respective targets each other, wherein the partition plate is configured by arranging a plurality of component plates of which respective end portions are butted with each other at an interval and connecting two adjacent component plates of the plurality of component plates with the use of a connection cover which is provided so as to bridge butted end portions, such that a thermal expansion generated due to the film deposition processing is absorbed by a relative movement of the two adjacent component plates with respect to the connection covers, and a concave part is provided at either the connection cover and each of the two adjacent component plates to make a gap, between the connection cover and each of the two adjacent component plates, at a region apart from the butted end portions be larger than the gap at a region proximal to the butted end portions, and it is more preferred that, wherein the connection cover connects the two adjacent component plates by loosely fitting axes protruding at a surface of the connection cover into long holes formed in the end portions of the two adjacent component plates by penetrating in a thickness direction, to allow the component plates to move relative to each other within a gap configured for achieving the loosely fitting between the axes and the long holes.

In a sputtering apparatus including a plurality of targets in the processing chamber, the partition plate for isolating the targets each other is provided with thermal expansion absorption parts similar to the mechanism in the deposition preventive plate. In the facing part between each of the component plates and the connection cover, the metal film is formed on the facing surface with the processing region during film deposition processing. The facing surface has a gap set to be large by the concave part, such that the possibility of contacting with each other when the component plates move relative to each other for absorbing the thermal expansion is low, and a deterioration in the film deposition quality due to mixing of the peeled-off material could be prevented.

According to the embodiment of the present disclosure, it is possible to satisfy both of the sealing function by the deposition preventive plate, and a peeling-off prevention of the metal film when the component plates move relative to each other for absorbing the thermal expansion, and achieve the film deposition processing with a high operation rate while maintaining a high film deposition quality.

The above and further objects and features will more fully be apparent from the following detailed description with accompanying drawings.

BRIEF DESCRIPTION OF THE DRAWINGS

FIG. 3A is an enlarged view near an overlapped part in the component plates forming the deposition preventive plate.

FIG. 3B is an enlarged view near an overlapped part in the component plates forming the deposition preventive plate.

FIG. 6 is an enlarged view of a connection portion between component plates forming the partition plate.

FIG. 7 is a view as viewed from an arrow along line VII-VII of FIG. 6.

DETAILED DESCRIPTION OF NON-LIMITING EXAMPLE EMBODIMENTS

Figure 1:
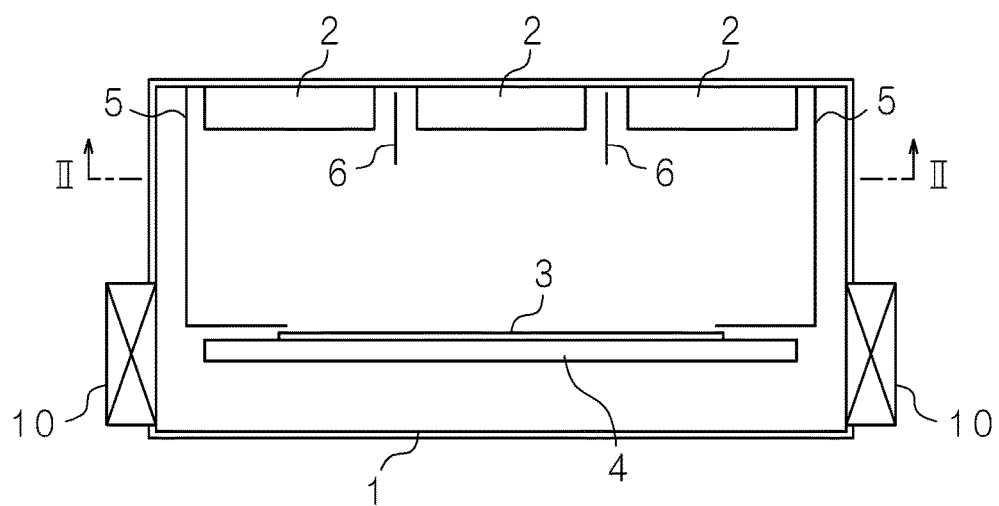
FIG. 1 is a longitudinal cross-sectional view schematically illustrating a film deposition apparatus of an embodiment.
Figure 2:
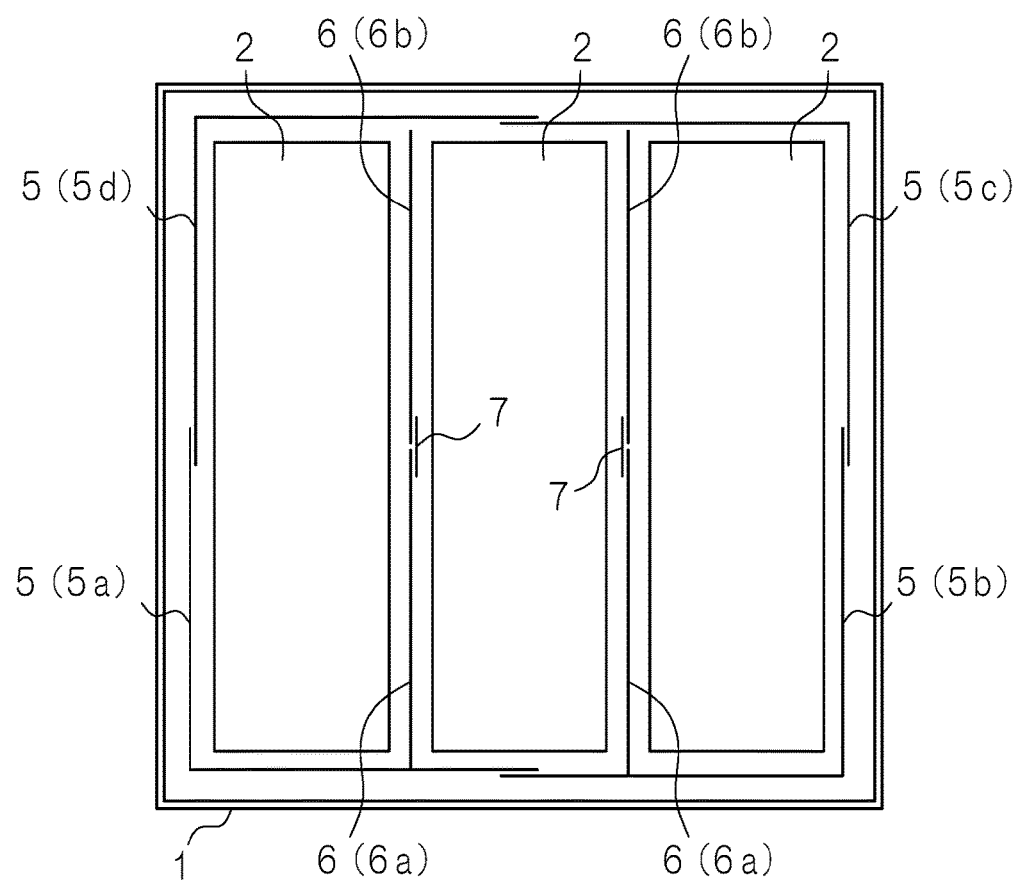
FIG. 2 is a cross-sectional view taken on line II-II of FIG. 1.

Hereinafter, the present disclosure will be described in detail with reference to the accompanying drawings illustrating embodiments thereof. FIG. 1 is a cross-sectional view schematically illustrating a film deposition apparatus of an embodiment, and FIG. 2 is a cross-sectional view taken on line II-II of FIG. 1. The film deposition apparatus illustrated in the drawings is configured as a sputtering apparatus in which targets 2 are disposed inside of a processing chamber 1 formed in a rectangular box shape, and film deposition processing is performed on one surface of a substrate 3 which is positioned to face the targets 2, but the configuration which will be described below may also be applied to a vacuum deposition apparatus such as a CVD apparatus, a PVD apparatus or the like.

The processing chamber 1 includes openable and closable gate valves 10 and 10 provided at positions to face each other, and is connected to other processing chambers, a load lock chamber, a heating chamber, or an unload chamber (not illustrated) through the gate valves 10 and 10. The substrate 3 is held by a holding body 4 formed in a tray shape, and is carried into the processing chamber 1 via one opened gate valve 10 together with the holding body 4, and then, as illustrated in FIG. 1, is positioned so as to face the targets 2. The substrate 3 positioned as described above is subjected to publicly known sputtering processing in which, after causing an inside of the processing chamber 1 to be in a high vacuum condition by closing the gate valves 10 and 10 on both sides of the processing chamber 1, rare gases are introduced into the processing chamber 1, and a high voltage is applied between the targets 2 and the substrate 3, whereby a thin film made of a metallic material of the targets 2 is deposited thereon. The substrate 3 after processing is carried out from the processing chamber 1 via the other opened gate valve 10.

The processing chamber 1 is provided with deposition preventive plates 5 therein. The deposition preventive plates 5 cover inner walls of the processing chamber 1 including a surface of the holding body 4 holding the substrate 3 at positions separated at an appropriate length therefrom, and are arranged so as to surround a processing region for the substrate 3 to be deposited as described above. The deposition preventive plates 5 arranged as described above function to prevent film deposition materials (target atoms) sprung out from the targets 2 during film deposition processing from reaching and being attached to the inner walls of the processing chamber 1 and the surface of the holding body 4, and prevent forming an unnecessary metal film thereon.

The deposition preventive plate 5 includes, as illustrated in FIG. 2, four component plates 5a, 5b, 5c and 5d. The respective component plates 5a, 5b, 5c and 5d are substantially the same shape as each other, and cover the inner walls extending in two directions from corner portions of four places of the processing chamber 1 over a substantially half length of the inner wall. End portions of two adjacent component plates selected from the component plates 5a, 5b, 5c and 5d are overlapped with each other over an appropriate width at substantially central portions of four side inner walls, and are combined with each other while being relatively movable in a width direction at the overlapped parts in the two adjacent component plates.

The component plates 5a, 5b, 5c and 5d are expanded due to a heat generated in the processing chamber 1 during the film deposition processing of the substrate 3. The overlapped parts are provided in order to absorb a thermal expansion of the component plates 5a, 5b, 5c and 5d by the above-described relative movement of the two adjacent component plates in the width direction. Further, the shape and number of the component plates 5a, 5b, 5c and 5d forming the deposition preventive plate 5 are not limited to the shape and number illustrated in FIG. 2, and could be appropriately set as necessary.

Three targets 2 are arranged inside of the deposition preventive plates 5, and partition plates 6 are provided between the respective targets 2 to isolate the respective arrangement sites. As illustrated in FIG. 2, the partition plate 6 is formed by butting end portions of two adjacent component plates 6a and 6b with each other at an interval, and connecting the end portions by connection covers 7 bridged between the end portions, while an end portion of component plates 6a, which does not face component plate 6b, is attached to inner surfaces of the component plates 5a or 5b forming the deposition preventive plates 5, so that the partition plate 6 extends between the adjacent targets 2 and 2 toward the component plates 5d and 5c facing the component plates 5a and 5b.

The component plates 6a and 6b of the partition plate 6 are expanded due to the heat generated in the processing chamber 1 during the film deposition processing of the substrate 3. The connection covers 7 connect the component plates 6a and 6b while being relatively movable in a length direction as described below, and the thermal expansion of the component plates 6a and 6b is absorbed by the relative movement of the component plates 6a and 6b with respect to these connection covers 7.

FIG. 3 is an enlarged view near an overlapped part in the component plates 5a and 5b forming the deposition preventive plate 5. As illustrated in this drawing, the component plates 5a and 5b are overlapped with each other over an appropriate width at an initial gap $G_1$ as the component plate 5a is set proximal to the processing region, and isolate the inner wall of the processing chamber 1 from the processing region.

FIG. 3A illustrates the overlapped part of Embodiment 1, and the component plate 5b is provided with a concave part 50 having a rectangular cross section. The concave part 50, which has the rectangular cross section, is formed over an appropriate width extending, in the width direction of the component plate 5b, toward both sides from a position regarded as a center which faces an end edge of the component plate 5a, and makes a gap provided in a side communicating with the processing region be larger than that provided in the other side.

During the above-described film deposition processing on the component plates 5a and 5b overlapped with each other as described above, the film deposition materials sprung out from the targets 2 are attached to one face (the surface) of the component plates 5a and 5b facing the processing region to form metal films 8. The film deposition material also enters into the concave part 50, such that the metal films 8 are also formed on a bottom of the concave part 50 and a rear surface of the component plate 5a facing the bottom as illustrated in the drawing.

Meanwhile, the component plates 5a and 5b are expanded by an action of heat generated in the processing chamber 1 during the film deposition processing, and as described above, the thermal expansion is absorbed by the relative movement occurred in the overlapped part in the width direction. In this case, there is a possibility that the metal films 8 formed on the overlapped part in the component plates 5a and 5b contact with each other to be peeled-off, but in FIG. 3A, since a large gap is secured between the bottom of the concave part 50 and the rear surface of the component plate 5a, on which the metal films 8 are formed, it is possible to prevent the peeling off of the metal films 8 by avoiding the contact between the metal films 8 at the position.

In addition, in an end edge of the component plate 5b out of a region of the concave part 50, the initial gap $G_1$ is maintained between the component plate 5a, and thus the contact therebetween may occur. However, the contact position is separated from the processing region, and an amount of the metal film 8 formed on the contact position is small, such that even if the peeling off of the metal film 8 formed on the contact position occurs, the possibility of returning it to the processing region is low, and a problem that the peeled-off metal from the contact position is mixed during the film deposition of the substrate 3 to result in a deterioration in a film deposition quality could be effectively avoided over a long period of time. Accordingly, it is possible to reduce a frequency of taking measures to solve the above-described problems such as a replacement of the deposition preventive plates 5, and contribute to improvement in an operation rate of the film deposition apparatus.

The gap $G_1$ between the component plate 5a and the end edge of the component plate 5b serves as a labyrinth gap to seal the inner wall of the processing chamber 1, the processing region side, and the inner wall side. Accordingly, it is possible to prevent the film deposition material of the processing region from leaking out to an outside of the processing region, and it cannot affect the original function of the deposition preventive plates 5 that prevents the film deposition material from being attached to the inner wall of the processing chamber 1.

FIG. 3B illustrates the overlapped part which is not provided with the concave part 50. In this case, the metal films 8 formed on facing surfaces of the component plates 5a and 5b in the overlapped part are located to be close to each other. So, if the component plates 5a and 5b move relative to each other, it is highly probably that the metal films 8 contact with each other to be peeled-off. The contact and peeling-off of the metal films 8 may be reduced by increasing an initial gap $G_2$ in the overlapped part, but the sealing function of the gap may be decreased, and the original function of the deposition preventive plates 5 may be affected.

Figure 4A:
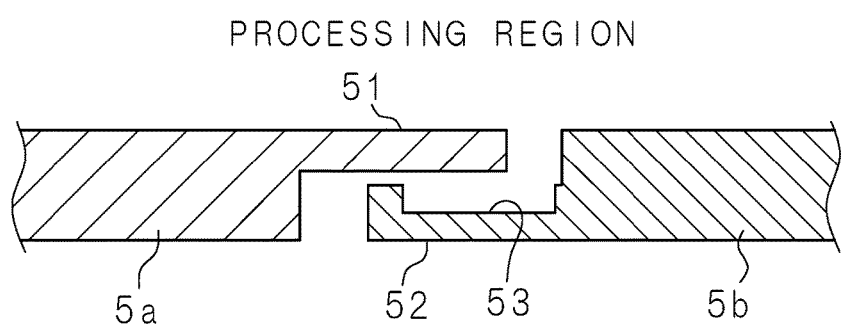
FIG. 4A is an enlarged view near an overlapped part in the component plates of Embodiment 2.

FIG. 4 is an enlarged view near an overlapped part in the component plates 5a and 5b of Embodiment 2. The component plates 5a and 5b in this drawing are provided with thin parts 51 and 52 at end portions thereof, which extend from the end portions and have a substantially half thickness of the end portions. These thin parts 51 and 52 are overlapped at a gap to form an overlapped part arranged in the same level, in view of surfaces facing the processing region or the inner wall, as the other parts (non-overlapped parts) of the component plates 5a and 5b.

In the overlapped part, a base portion of the thin part 52 which extends from the component plate 5b and is located at a region apart from the processing region (at a region proximal to the inner wall of the processing chamber 1) is provided with a concave part 53. The concave part 53 has a rectangular cross section similar to that of the concave part 50 of Embodiment 1, and is formed over an appropriate width extending, in the width direction of the component plate 5b, toward both sides from a position regarded as a center which faces the end edge of the component plate 5a, in more detail, the end edge of the thin part 51. The concave part 53 formed as described above brings out the same effect as the concave part 50 of Embodiment 1, and can effectively prevent a decrease in the film deposition quality of the substrate 3 while maintaining a leakage preventing effect of the film deposition material.

In this Embodiment 2, since the component plates 5a and 5b including the overlapped part in the thin parts 51 and 52 have two flat surfaces, it is possible to form the deposition preventive plates 5 which do not have an uneven plane. In addition, since the gap between the thin parts 51 and 52 is formed in a crank-shaped form as illustrated in the drawing, it is possible to increase the labyrinth effect at the gap, and achieve a good sealing function.

Figure 4B:
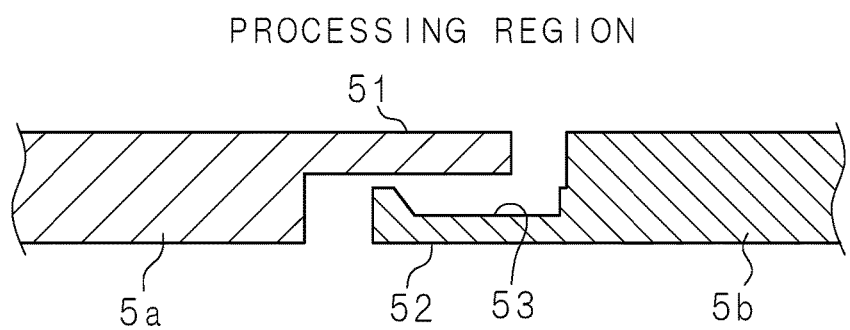
FIG. 4B is an enlarged view near an overlapped part in the component plates of Embodiment 2.

In the concave part 53 illustrated in FIG. 4B, in a sectional view according to a width direction of an overlapped part, the end portion of the component plate 5b, in more detail, the end portion of the thin part 52 has a tapered shape toward the thin plate 51. According to this configuration, length in a width direction of an overlapped part of the thin parts 51 and 52 is narrowed, and the peeling-off of the metal film due to the contact at the site could be reduced.

Figure 5A:
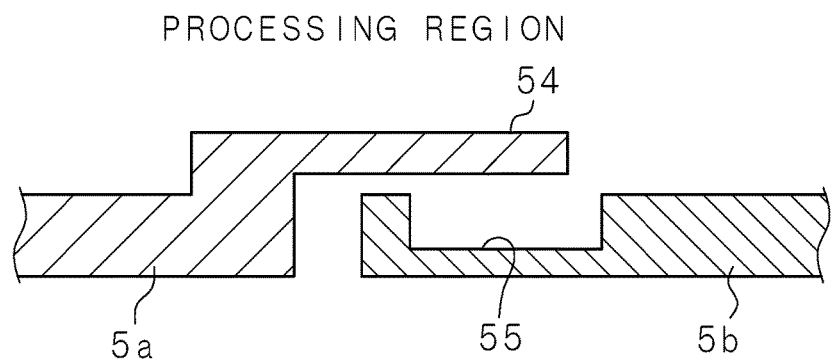
FIG. 5A is an enlarged view near an overlapped part in the component plates of Embodiment 3.

FIG. 5 is an enlarged view near an overlapped part in the component plates 5a and 5b of Embodiment 3. In FIG. 5A, the component plate 5a is provided with a crank-shaped extension part 54 at the end portion thereof. The extension part 54 is overlapped with the end portion of the component plate 5b from a side of the processing region to form the overlapped part. The component plate 5b is provided with a concave part 55 in a facing surface thereof with the processing region. The concave part 55 has a rectangular cross section, and is formed over an appropriate width extending, in the width direction of the component plate 5b, toward both sides from a position regarded as a center which faces the end edge of the component plate 5a, in more detail, the end edge of the extension part 54.

Figure 5B:
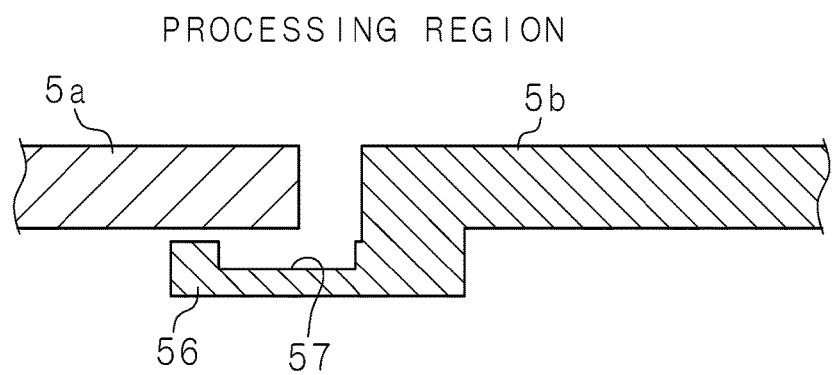
FIG. 5B is an enlarged view near an overlapped part in the component plates of Embodiment 3.

In FIG. 5B, the component plate 5b is provided with a crank-shaped extension part 56 at the end portion thereof. The extension part 56 is overlapped with the end portion of the component plate 5a from a side opposite to the processing region to form the overlapped part. A base portion of the extension part 56 is provided with a concave part 57 in a facing surface thereof with the processing region. The concave part 57 has a rectangular cross section, and is formed over an appropriate width extending, in the width direction of the component plate 5b, toward both sides from a position regarded as a center which faces the end edge of the component plate 5a.

The concave parts 55 and 57 illustrated in Embodiment 3 bring out the same effect as the concave parts 50 and 53 of Embodiments 1 and 2, and can effectively prevent a decrease in the film deposition quality of the substrate 3 while maintaining a leakage preventing effect of the film deposition material.

Note that, it is needless to say that the concave parts 50, 53, 55 and 57 as described above can be formed in not only the overlapped part in the component plates 5a and 5b illustrated in FIGS. 3 to 5, but also the overlapped part in two adjacent component plates selected from the component plates 5a to 5d forming the deposition preventive plate 5, respectively. In addition, a shape in the cross section of the concave parts 50, 53, 55 and 57 is not limited to the rectangular shape illustrated in FIGS. 3 to 5, and may be other shapes such as semi-circle, and semi-elliptic.

Furthermore, it is preferable that the concave parts 50, 53, 55 and 57 are formed as a concave groove which is continued over an entire length of the respective overlapped parts in a longitudinal direction thereof. Thereby, it is possible to prevent the peeling-off of the metal film 8 over the entire length of the overlapped part, but the concave parts 50, 53, 55 and 57 could be intermittently or locally provided in the longitudinal direction.

FIG. 6 is an enlarged view of a connection portion between component plates 6a and 6b forming the partition plate 6, and FIG. 7 is a view as viewed from an arrow along line VII-VII of FIG. 6. As illustrated in the drawings, the component plates 6a and 6b butt at respective end portions thereof with each other at an interval, and are connected by a connection cover 7 bridging between the butted end portions. As illustrated in FIG. 6, the connection cover 7 is a member having a flat plate shape in the cross section, and has axes 70 and 70 which protrude at positions of one surface thereof separated from each other at an appropriate length and which form a right angle with the one surface. In addition, the component plates 6a and 6b include long holes 60 and 60 which are formed in the vicinity of the butted end portions by penetrating in a thickness direction. These long holes 60 and 60 have an oval shape elongated in a longitudinal direction of the component plates 6a and 6b, as illustrated in FIG. 7.

The connection of the component plates 6a and 6b by the connection cover 7 as illustrated in FIG. 6 is achieved by loosely fitting the axes 70 and 70 into the long holes 60 and 60 provided in the component plates 6a and 6b, and screwing nuts 71 and 71 to screw parts provided on the end portions of the respective axes 70 and 70. By the connection, the component plates 6a and 6b may move relative to each other in the longitudinal direction within a gap configured for achieving the loosely fitting between the long holes 60 and 60 and the axes 70 and 70, and as described above, the thermal expansion of the component plates 6a and 6b due to the film deposition processing is absorbed by the relative movement thereof with respect to these connection covers 7.

Further, as illustrated in FIG. 7, the connection cover 7 has a wider width than the component plates 6a and 6b, so the connection cover 7 has protruding portions at the both sides of the component plates 6a and 6b in the width direction. The connection cover 7 is configured such that the component plates 6a and 6b are sandwiched between flanges 72 and 72 provided at the protruding portions of the connection cover 7, so as to have a continuity in the longitudinal direction of the component plates 6a and 6b.

As illustrated in FIG. 6, the component plates 6a and 6b are provided with concave parts 61 and 61 in the overlapped portions with the connection cover 7. The concave parts 61 and 61, which have a rectangular cross section, are formed over an appropriate width extending, in the longitudinal direction of the component plates 6a and 6b, toward both sides from center positions each of which faces the end edges of the connection cover 7, and make a gap between the connection cover 7 and the component plates 6a or 6b at a region apart from the butted end portions be larger than the gap at a region proximal to the butted end portions.

The connection site of the component plates 6a and 6b configured as described above faces the processing region in which the film deposition processing is performed on the substrate 3, and the metal film is formed on a facing part between the component plates 6a and 6b and the connection cover 7. However, since the gaps between the component plates 6a and 6b and the connection cover 7 are largely formed by the concave parts 61 and 61 provided as described above, even when the above-described relative movement of the two adjacent component plates for absorbing the thermal expansion occurs, it is possible to prevent the contact and peeling off of the attached metal films, and prevent a decrease in the film deposition quality of the substrate 3 due to mixing of metal peeled off from the sites.

Figure 8:
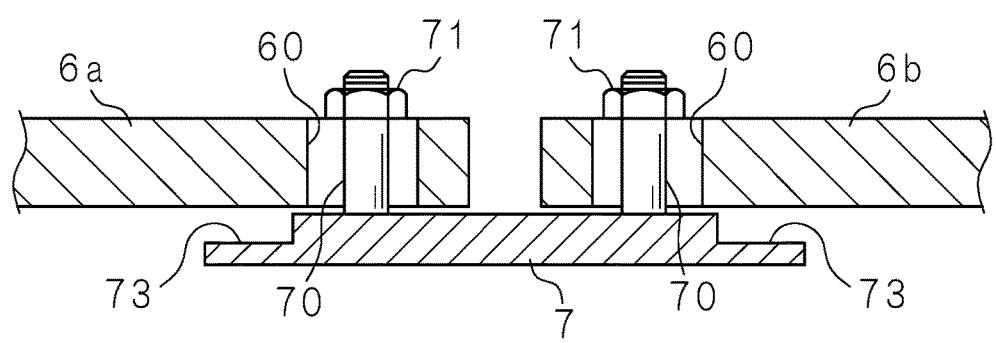
FIG. 8 is an enlarged view illustrating a connection part of the component plates according to another embodiment.

FIG. 8 is an enlarged view illustrating a connection part of the component plates 6a and 6b according to another embodiment. In this embodiment, concave parts 73 are provided not in the component plates 6a and 6b but in a connection cover 7, and, in the facing parts between the connection cover 7 and each of the component plates 6a and 6b, make a gap at a region apart from the butted part of the component plates 6a and 6b be larger than a gap at a region proximal to the butted part. Also in this embodiment, the same effects as the configuration illustrated in FIGS. 6 and 7 could be obtained.

Note that, it is needless to say that the shape in the cross section of the concave parts 61 and 73 provided as described above is not limited to the rectangular shape illustrated in FIGS. 3 to 5, and may be other shapes such as semi-circle, and semi-elliptic.

It is to be noted that, as used herein and in the appended claims, the singular forms "a", "an", and "the" include plural referents unless the context clearly dictates otherwise.

The embodiments as disclosed are illustrative and not restrictive in all respects. The scope of the present invention is defined by the appended claims rather than by the description preceding them, and all changes that fall within metes and bounds of the claims, or equivalence of such metes and bounds thereof are therefore intended to be embraced by the claims.

The invention claimed is:

1. A film deposition apparatus, comprising:
   a deposition preventive plate which is located in a processing chamber performing film deposition processing on a substrate so as to surround a processing region in the processing chamber for processing on the substrate, and which prevents a film deposition material from being attached to an inner wall of the processing chamber, wherein the deposition preventive plate is configured by arranging a plurality of component plates of which respective end portions are overlapped with each other at a gap, such that a thermal expansion generated due to the film deposition processing is absorbed by a relative movement of an overlapped part in two adjacent component plates of the plurality of component plates in a width direction of the overlapped part, and
   a deposition preventive plate concave part is provided at the overlapped part to make the gap, wherein a width of the gap at a portion communicating with the processing region is larger than a width of the gap at a portion communicating with a region between the deposition preventive plate and the inner wall of the processing chamber,
   thin parts provided in the respective end portions of the two adjacent component plates are overlapped with each other, wherein the thin parts are thinner in the width direction than portions in a non-overlapped part in the two adjacent component plates,
   a surface facing the processing region in the overlapped part and a surface facing the processing region in non-overlapped part are on the same plane, and a surface facing the inner wall in the overlapped part and a surface facing the inner wall in non-overlapped part are on the same plane,
   a plurality of targets disposed inside of the processing chamber; and
   a partition plate configured to isolate the respective targets from each other,
   wherein the partition plate is configured by arranging a plurality of partition component plates of which respective end portions are butted with each other at an interval and connecting two adjacent partition component plates of the plurality of partition component plates with the use of a connection cover which is provided so as to bridge butted end portions, such that a thermal expansion generated due to the film deposition processing is absorbed by a relative movement of the two adjacent partition component plates with respect to the connection cover, and
   a partition plate concave part is provided at the connection cover and each of the two adjacent partition component plates to make a gap between the connection cover and each of the two adjacent partition component plates at a region apart from the butted end portions that is larger than a gap at a region proximal to the butted end portions.

2. The film deposition apparatus according to claim 1, wherein the deposition preventative plate concave part is a concave groove which is continued in a longitudinal direction of the overlapped part.

3. The film deposition apparatus according to claim 1, wherein the deposition preventative plate is provided in one of the thin parts which has the surface facing the inner wall.

4. The film deposition apparatus according to claim 2, wherein the deposition preventative plate is provided in one of the thin parts which has the surface facing the inner wall.

5. The film deposition apparatus according to claim 1, wherein
   the connection cover connects the partition component plates by loosely fitting axes protruding at a surface of the connection cover into long holes formed in the end portions of the partition component plates by penetrating in a thickness direction, to allow the partition component plates to move relative to each other within a gap configured for achieving the loosely fitting between the axes and the long holes.

6. The film deposition apparatus according to claim 2, wherein the connection cover connects the partition component plates by loosely fitting axes protruding at a surface of the connection cover into long holes formed in the end portions of the partition component plates by penetrating in a thickness direction, to allow the partition component plates to move relative to each other within a gap configured for achieving the loosely fitting between the axes and the long holes.

7. The film deposition apparatus according to claim 3, wherein the connection cover connects the partition component plates by loosely fitting axes protruding at a surface of the connection cover into long holes formed in the end portions of the partition component plates by penetrating in a thickness direction, to allow the partition component plates to move relative to each other within a gap configured for achieving the loosely fitting between the axes and the long holes.

8. The film deposition apparatus according to claim 4, wherein the connection cover connects the partition component plates by loosely fitting axes protruding at a surface of the connection cover into long holes formed in the end portions of the partition component plates by penetrating in a thickness direction, to allow the partition component plates to move relative to each other within a gap configured for achieving the loosely fitting between the axes and the long holes.

9. The film deposition apparatus according to claim 1, wherein an end portion of one of the two adjacent component plates of the deposition preventive plate has a tapered shape.

10. A film deposition apparatus, comprising: a deposition preventive plate which is located in a processing chamber performing film deposition processing on a substrate so as to surround a processing region in the processing chamber for processing on the substrate, and which prevents a film deposition material from being attached to an inner wall of the processing chamber, wherein the deposition preventive plate is configured by arranging a plurality of component plates of which respective end portions are overlapped with each other at a gap, such that a thermal expansion generated due to the film deposition processing is absorbed by a relative movement of an overlapped part in two adjacent component plates of the plurality of component plates in a width direction of the overlapped part, and a deposition preventive plate concave part is provided at the overlapped part to make the gap, wherein a width of the gap at a portion communicating with the processing region is larger than a width of the gap at a portion communicating with a region between the deposition preventive plate and the inner wall of the processing chamber, further comprising:

a plurality of targets disposed inside of the processing chamber; and a partition plate configured to isolate the respective targets each other, wherein the partition plate is configured by arranging a plurality of component plates of which respective end portions are butted with each other at an interval and connecting two adjacent component plates of the plurality of component plates with the use of a connection cover which is provided so as to bridge butted end portions, such that a thermal expansion generated due to the film deposition processing is absorbed by a relative movement of the two adjacent component plates with respect to the connection covers, and a partition plate concave part is provided at either the connection cover and each of the two adjacent component plates to make a gap between the connection cover and each of the two adjacent component plates at a region apart from the butted end portions be larger than the gap at a region proximal to the butted end portions.

11. The film deposition apparatus according to claim 10, wherein the deposition preventative plate concave part is a concave groove which is continued in a longitudinal direction of the overlapped part.

12. The film deposition apparatus according to claim 10, wherein the connection cover connects the partition component plates by loosely fitting axes protruding at a surface of the connection cover into long holes formed in the end portions of the partition component plates by penetrating in a thickness direction, to allow the partition component plates to move relative to each other within a gap configured for achieving the loosely fitting between the axes and the long holes.

13. The film deposition apparatus according to claim 11, wherein the connection cover connects the partition component plates by loosely fitting axes protruding at a surface of the connection cover into long holes formed in the end portions of the partition component plates by penetrating in a thickness direction, to allow the partition component plates to move relative to each other within a gap configured for achieving the loosely fitting between the axes and the long holes.

14. The film deposition apparatus according to claim 10, wherein an end portion of one of the two adjacent component plates of the deposition preventive plate has a tapered shape.

* * * * *